(12) United States Patent
Cheng et al.

(10) Patent No.: US 8,815,734 B2
(45) Date of Patent: Aug. 26, 2014

(54) USE OF GAS CLUSTER ION BEAM TO REDUCE METAL VOID FORMATION IN INTERCONNECT STRUCTURES

(75) Inventors: Kangguo Cheng, Guilderland, NY (US); Junli Wang, Slingerlands, NY (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 13/290,577

(22) Filed: Nov. 7, 2011

(65) Prior Publication Data

US 2013/0113101 A1    May 9, 2013

(51) Int. Cl.
*H01L 21/4763* (2006.01)

(52) U.S. Cl.
USPC ........... 438/640; 438/643; 438/675; 438/701; 257/E21.578

(58) Field of Classification Search
USPC ........................................................ 438/515
See application file for complete search history.

(56) References Cited

U.S. PATENT DOCUMENTS

| | | | |
|---|---|---|---|
| 5,269,880 A | 12/1993 | Jolly et al. | |
| 6,117,781 A * | 9/2000 | Lukanc et al. | 438/692 |
| 6,225,698 B1 | 5/2001 | Tang | |
| 6,565,759 B1 | 5/2003 | Chen et al. | |
| 6,800,180 B1 * | 10/2004 | Leiphart | 204/192.3 |
| 6,812,147 B2 * | 11/2004 | Skinner et al. | 438/690 |
| 6,911,374 B2 | 6/2005 | Lin et al. | |
| 7,456,097 B1 * | 11/2008 | Hill et al. | 438/637 |
| 7,709,344 B2 | 5/2010 | Chen et al. | |
| 7,781,332 B2 | 8/2010 | Arnold et al. | |
| 7,816,253 B2 * | 10/2010 | Chen et al. | 438/622 |
| 7,838,428 B2 | 11/2010 | Chen et al. | |
| 7,943,527 B2 | 5/2011 | Kumar et al. | |
| 7,968,422 B2 | 6/2011 | Hautala | |
| 7,994,002 B2 | 8/2011 | Chang et al. | |
| 8,088,685 B2 * | 1/2012 | Lin et al. | 438/618 |
| 2004/0137733 A1 * | 7/2004 | Hautala | 438/689 |
| 2004/0222082 A1 * | 11/2004 | Gopalraja et al. | 204/192.3 |
| 2006/0030151 A1 * | 2/2006 | Ding et al. | 438/687 |

* cited by examiner

*Primary Examiner* — Stephen W Smoot
(74) *Attorney, Agent, or Firm* — Scully, Scott, Murphy & Presser, P.C.; Catherine Ivers, Esq.

(57) ABSTRACT

A gas cluster ion beam process is used to reduce and/or even eliminate metal void formation in an interconnect structure. In one embodiment, gas cluster ion beam etching forms a chamfer opening in an interconnect dielectric material. In another embodiment, gas cluster ion beam etching reduces the overhang profile of a diffusion barrier or a multilayered stack of a diffusion barrier and a plating seed layer that is formed within an opening located in an interconnect dielectric material. In yet another embodiment, a gas cluster ion beam process deactivates a surface of an interconnect dielectric material that is located at upper corners of an opening that is formed therein. In this embodiment, the gas cluster ion beam process deposits a material that deactivates the upper corners of each opening that is formed into an interconnect dielectric material.

17 Claims, 3 Drawing Sheets

US 8,815,734 B2

USE OF GAS CLUSTER ION BEAM TO REDUCE METAL VOID FORMATION IN INTERCONNECT STRUCTURES

BACKGROUND

The present disclosure relates to a semiconductor structure and a method of forming the same. More particularly, the present disclosure relates to methods to reduce metal void formation in an interconnect structure utilizing a gas cluster ion beam process as well as interconnect structures that are formed from the same.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than silicon dioxide.

Metal voids in interconnect structures (including middle-of-the-line (MOL) and back-end-of-the-line (BEOL) structures) are a major performance, yield and potentially reliability detractor for 32 nm and smaller features. One major cause of the metal void is pinching off at the top of the openings (via/trench) by the diffusion barrier/adhesion liner/seed deposition processes which are typically performed using physical vapor deposition (PVD). Pinching will get significantly worse if the incoming profile is re-entrant. By "re-entrant" it is meant the diameter of the opening at the top of the via/trench is smaller than the remainder of the opening. Pinching will then affect the subsequent bulk metal fill leading to voids.

A need thus exists to provide interconnect structures in which metal voids are substantially reduced or totally eliminated therefrom.

SUMMARY

A gas cluster ion beam process is used to reduce and/or even eliminate metal void formation in an interconnect structure. In one embodiment, gas cluster ion beam etching can be used to form a chamfer opening in an interconnect dielectric material. By "chamfer opening" it is meant that the upper corners of an opening formed into the interconnect dielectric material are beveled such that the upper surface portion of the opening located in the interconnect dielectric material has a width that is greater than the width of the lower portion of the opening. In another embodiment, gas cluster ion beam etching can be used to reduce the overhang profile of a diffusion barrier or a multilayered stack of a diffusion barrier and a plating seed layer that is formed within an opening that is located in an interconnect dielectric material. In yet another embodiment, a gas cluster ion beam process can be used to deactivate a surface of an interconnect dielectric material that is located at upper corners of an opening that is formed therein. In this embodiment, the gas cluster ion beam process deposits a material that deactivates the upper corners of each opening that is formed into an interconnect dielectric material.

In one embodiment, a method of reducing metal void formation in an interconnect structure is provided. In this embodiment, the method includes forming a plurality of openings within an interconnect dielectric material. Each opening of the plurality of openings has upper corners that are substantially square. A gas cluster ion beam etching process is then performed to the upper corners of each opening to provide beveled corners. In accordance with the present disclosure, the gas cluster ion beam etching process includes beams of gas cluster ions each of which has an angle incident to the upper surface of the interconnect dielectric material of 5° or less. A diffusion barrier is then formed within each opening of the plurality of openings, and thereafter a conductive material is formed atop the diffusion barrier. Portions of the diffusion barrier and the conductive material that extend outside each opening of the plurality of openings are then removed providing a planarized interconnect structure.

In another embodiment, a method of reducing metal void formation in an interconnect structure is provided. In this embodiment, the method includes forming a plurality of openings within an interconnect dielectric material. Each opening of the plurality of openings has upper corners that are substantially square. At least one material is formed within each opening of the plurality of openings. The at least one material has an overhang profile located at the upper corners of each opening of the plurality of openings. A gas cluster ion beam etching process is performed to the overhang profile of the at least one material that is located at the upper corners of each opening to reduce the overhang profile by at least 10%. The gas cluster ion beam etching process includes beams of gas cluster ions each of which has an angle incident to the upper surface of the interconnect dielectric material of 5° or less. Next, a conductive material is formed within the remaining portions of each opening of the plurality of openings. Portions of the at least one material having the reduced overhang profile and the conductive material that extend outside each opening of the plurality of openings are then removed to provide a planarized interconnect structure.

In another embodiment, a method of reducing metal void formation in an interconnect structure is provided. In this embodiment, the method includes forming a plurality of openings within an interconnect dielectric material. Each opening of the plurality of openings has upper corners that are substantially square. A gas cluster ion beam process is then performed to the upper corners of each opening to provide deactivated corners within the interconnect dielectric material at the upper corners. The gas cluster ion beam process includes beams of gas cluster ions of a deactivating gas each of which has an angle incident to the upper surface of the interconnect dielectric material of 5° or less. A diffusion barrier is formed within each opening of the plurality of openings. Next, a conductive material is formed atop the diffusion barrier. Thereafter, portions of the diffusion barrier and the conductive material that extend outside each opening of the plurality of openings are removed to provide a planarized interconnect structure.

In another aspect, the present disclosure provides an interconnect structure. The interconnect structure includes an interconnect dielectric material having a plurality of openings located therein. At least one of the openings of the plurality of openings is a line opening. The line opening has either beveled corners or deactivated regions located at an upper portion thereof. A diffusion barrier and a conductive material are located within each opening of the plurality of openings. The diffusion barrier and the conductive material each has an upper surface that is coplanar with an upper surface of the interconnect dielectric material.

DETAILED DESCRIPTION

The present disclosure which provides methods to reduce metal void formation in an interconnect structure utilizing a gas cluster ion beam process as well as interconnect structures that are formed from the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
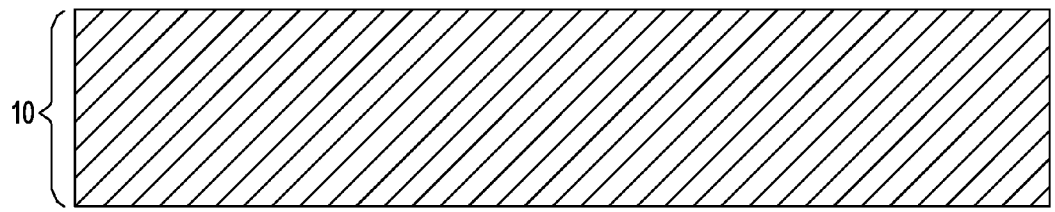
FIG. 1 is a pictorial representation (through a cross sectional view) of an interconnect dielectric material that can be employed in one embodiment of the present disclosure.

Reference is first made to FIG. 1, which illustrates an interconnect dielectric material 10 that can be employed in one embodiment of the present disclosure. The interconnect dielectric material 10 shown in FIG. 1 is typically formed on a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present disclosure also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The interconnect dielectric material 10 may comprise any middle-of-the-line (MOL) or back-end-of-the-line (BEOL) dielectric including inorganic dielectrics or organic dielectrics. The interconnect dielectric material 10 may be porous or non-porous. Porous dielectric materials generally have a lower dielectric constant than the non-porous counterparts. Some examples of suitable dielectrics that can be used as the interconnect dielectric material 10 include, but are not limited to, $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the interconnect dielectric material 10 has a dielectric constant that is about 4.0 or less. In another embodiment, the interconnect dielectric material 10 has a dielectric constant of about 2.8 or less. All dielectric constants mentioned in this disclosure are relative to a vacuum unless otherwise noted. Dielectrics having a dielectric constant of about 4.0 or less generally have a lower parasitic crosstalk as compared with dielectric materials that have a higher dielectric constant than 4.0. The thickness of the interconnect dielectric material 10 may vary depending upon the dielectric material used as well as the exact number of dielectrics within the interconnect dielectric material 10. Typically, and for normal interconnect structures, the interconnect dielectric material 10 has a thickness from 200 nm to 450 nm.

Figure 2:
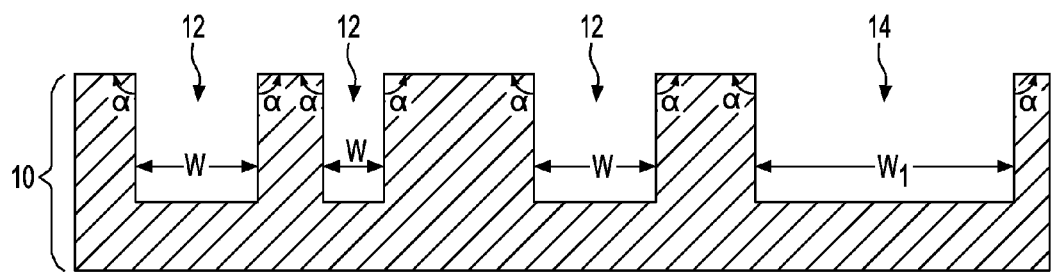
FIG. 2 is a pictorial representation (through a cross sectional view) illustrating the structure of FIG. 1 after forming a plurality of openings within the interconnect dielectric material.

Referring to FIG. 2, there is illustrated the structure of FIG. 1 after forming a plurality of openings within the interconnect dielectric material 10. The plurality of openings that are formed may include a via opening, a line, i.e., trench, opening, or a combined via and line opening. In FIG. 2, there is shown a plurality of via openings 12 and a line opening 14.

Each opening of the plurality of openings (12 and 14) can be formed utilizing techniques well known to those skilled in the art. For example, each opening of the plurality of openings (12 and 14) can be formed by lithography (i.e., applying a photoresist to the surface of the interconnect dielectric material 10, exposing the photoresist to a desired pattern of radiation, and developing the exposed resist utilizing a conventional resist developer), etching (dry etching or wet etching) an opening in the interconnect dielectric material 10. The term "dry etching" is used herein to denote an etching technique such as reactive-ion etching, ion beam etching, plasma etching or laser ablation.

When a combined via and line opening is formed, a second iteration of lithography and etching is typically employed. Also, in some embodiments, the via can be formed first, followed by the line. In another embodiments, the line can be formed first, then the via. In either instance, the via and line are in communication with each other.

Each via opening 12 is an opening that runs perpendicular to the underlying substrate and it generally has a width, w, as measured from one sidewall to another sidewall, of from 10 nm to less than 80 nm. Each line opening 14 which runs parallel to the underlying substrate has a width, $w_1$, which is greater than the width of each via opening 12. Typically, each line opening 14 has a width, $w_1$, measured from one sidewall to another sidewall, of from 15 nm to 80 nm. Each via opening 12 that is formed can have a same or different width and/or height. Each line opening 14 that is formed can have a same or different width and/or height.

Regardless of the type of opening that is formed, each of the openings of the plurality of openings (12 and 14) has a substantially square upper corner which is located at the intersection of the vertical sidewalls of each opening and the upper surface of the interconnect dielectric material 10. Stated in other terms, the angle, α, located at the intersection of the vertical sidewalls of each opening and the upper surface of the patterned interconnect dielectric material 10 is about 90°.

Figure 3A:
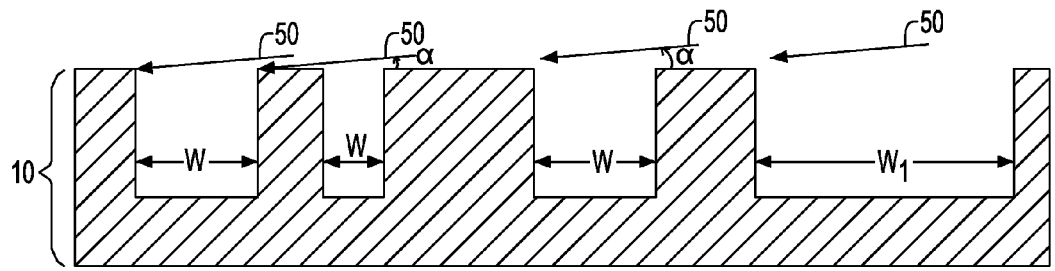
FIGS. 3A and 3B are pictorial representations (through cross sectional views) illustrating the structure of FIG. 2 during and after performing a gas cluster ion beam etching process in which upper corners of each opening that were formed into the interconnect dielectric material are beveled.
Figure 3B:
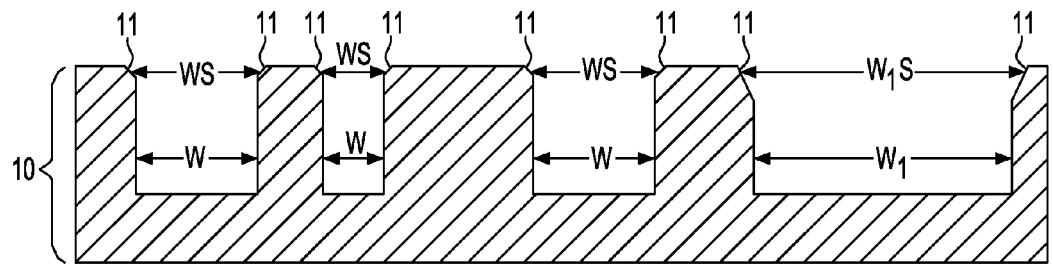

Referring to FIGS. 3A-3B, there is illustrated the structure of FIG. 2 during and after performing a gas cluster ion beam etching process in which the substantially square upper corners of each opening that was formed into the interconnect dielectric material are chamfered, i.e., beveled. In FIG. 3A, reference numeral 50 denotes a beam of gas cluster ions that are generated during the gas cluster ion beam etching process, while γ denotes the angle of each beam of gas cluster ions 50 incident to the upper surface of the interconnect dielectric material 10. In FIG. 3B, reference numeral 11 denotes the beveled corners that are produced at the upper corners of each opening of the plurality of openings (12 and 14) after subjecting the interconnect dielectric material 10 to the gas cluster ion beam etching process.

In this embodiment, the gas cluster ion beam etching process removes the substantially square corners of each opening of the plurality of openings (12 and 14) to provide a beveled corner 11 having a substantially flat and smooth surface that at one point intersects an upper surface of the interconnect dielectric material and at another point intersects the remaining substantially vertical sidewalls of each opening of the plurality of openings (12 and 14). As shown in FIG. 3B, the width of each opening of the plurality of openings (12 and 14) at the surface (i.e., surface width, ws or $w_1s$) of the interconnect dielectric material is now greater than the original width w or $w_1$ which remains at the bottom of each opening. In one embodiment, ws is 10% greater than w, while $w_1s$ is 20% greater than $w_1$. In another embodiment, ws is 15% greater than w, while $w_1s$ is 20% greater than $w_1$.

In the gas cluster ion beam process used to provide the beveled corners 11, beams composed of clusters of gas atoms, roughly 5,000 to 20,000 atoms in each cluster, can be singly ionized, accelerated, and upon impact with the substantially square corners to bevel the substantially square corners of each of the openings of the plurality of openings (12 and 14). The gas cluster ion beam process can be performed in a vacuum environment of any conventional ion-beam apparatus. As such, contamination control for the work piece surface can be obtained which is not the case using any wet or atmospheric-based etching methods. By using the gas cluster ion process, the ion cluster beam (dry) etches, i.e., sputters, away the corner surface of each opening and will reduce the roughness of the corner surface. Also, by employing gas cluster ion beam etching, the upper corners of the interconnect dielectric will not suffer plasma damage.

In one embodiment, the gas cluster ion beam etching can be performed with a dose from 1e12 clusters/cm$^2$ to 1e18 clusters/cm$^2$. In another embodiment, the gas cluster ion beam etching can be performed with a dose from 1e14 clusters/cm$^2$ to 1e18 clusters/cm$^2$. Other doses that are below and/or above the aforementioned ranges can also be employed in the present disclosure.

In one embodiment, the gas cluster ion beam etching that can be employed in the present disclosure can be performed at a pressure from $10^{-2}$ Torr to $10^{-6}$ Torr. In another embodiment, the gas cluster ion beam etching that can be employed in the present disclosure can be performed at a pressure from $10^{-3}$ Torr to $10^{-6}$ Torr. Other pressure values that are below and/or above the aforementioned ranges can also be employed in the present disclosure.

In one embodiment, the gas cluster ion beam etching that can be employed in the present disclosure can be performed at a power/energy from 2 keV to 80 keV. In another embodiment, the gas cluster ion beam etching that can be employed in the present disclosure can be performed at a power/energy from 10 keV to 60 keV. Other power/energy values that are below and/or above the aforementioned ranges can also be employed in the present disclosure.

In one embodiment of the present disclosure, the gas cluster ion beam etching can be performed at a temperature from 20° C. to 500° C. In another embodiment of the present disclosure, the gas cluster ion beam etching can be performed at a temperature from 20° C. to 400° C. Other temperatures that are below and/or above the aforementioned ranges can also be employed in the present disclosure.

In one embodiment, the gas cluster ion beam etching process is performed utilizing a beam of gas cluster ions 50 whose angle, γ, incident to the upper surface of the interconnect dielectric material 10 is 5° or less. In another embodiment, the gas cluster ion beam etching process is performed utilizing a beam of gas cluster ions 50 whose angle, γ, incident to the upper surface of the interconnect dielectric material 10 is from 1° to 3°.

In some embodiments of the present disclosure, the structure is held stationary by a chuck or other wafer holding means, while the beam of gas cluster ions 50 is rotated. In another embodiment, the structure is rotated while holding the beam of gas cluster ions 50 stationary. Either embodiment can be used to ensure complete beveling of each substantially square corners within each opening of the plurality of openings (12 and 14) that is formed into the interconnect dielectric material 10.

In one embodiment, the gas used in the gas cluster ion beam etching process may be composed of a reactive gas, including, but not limited to, nitrogen trifluoride ($NF_3$), carbon tetrafluoride ($CF_4$), methane ($CH_4$) and any combination thereof. The reactive gas can be used neat (i.e., 100% pure reactive gas), or the reactive gas can be admixed with a quantity of an inert gas such as, for example, neon (Ne), helium (He), argon (Ar), krypton (Kr) and/or xenon (Xe). In one embodiment, the quantity of reactive gas may be from 0.1% to 5%, with the remaining 99.9% to 95% comprising an inert gas as a carrier gas. In another embodiment, the quantity of reactive gas may be from 1% to 10%, with the remaining 99 to 90% comprising an inert gas as a carrier gas.

In another embodiment, the gas used in the gas cluster ion beam etching process may be composed of a non-reactive gas, including, but not limited to, neon (Ne), helium (He), argon (Ar), krypton (Kr), xeon (Xe) and any combination thereof. In this embodiment, the non-reactive gas is used neat.

In either embodiment (i.e., reactive vs. non-reactive gas), the beam of gas cluster ions 50 contains a uniform flux of cluster of atoms or molecules, and only 1 charge per several thousand atoms is used. The beam contains mainly uncharged atoms or molecules, there is less than 0.2% of species in the cluster that is charged. The size of the beam of gas cluster ions 50 can be adjusted and the beam of gas cluster ions 50 has a good resolution within the nm range.

Figure 4:
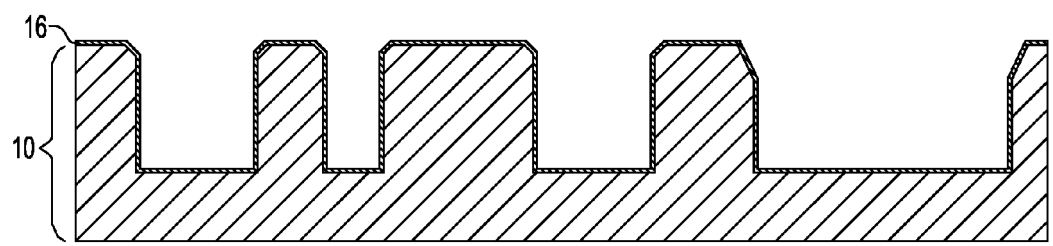
FIG. 4 is a pictorial representation (through a cross sectional view) illustrating the structure of FIG. 3B after forming a diffusion barrier on the exposed surfaces of the interconnect dielectric material including the beveled corners and within each of the plurality of openings.

Referring to FIG. 4, there is illustrated the structure of FIG. 3B after forming a diffusion barrier 16 on the exposed surfaces of the interconnect dielectric material 10 including the beveled corners 11 and within each opening of the plurality of openings (12 and 14).

The diffusion barrier 16 may comprise Ta, TaN, Ti, TiN, Ru, RuN, W, WN or any other material that can serve as a barrier to prevent conductive material from diffusing there through. In some embodiments, a combination of the above mentioned diffusion barrier materials, i.e., TiN/Ti or TaN/Ta, can be employed as diffusion barrier 16. The diffusion barrier 16 can be formed a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the diffusion barrier 16 may vary depending on the exact means of the deposition process as well as the material employed. Typically, the diffusion barrier 16 has a thickness from 4 nm to 40 nm, with a thickness from 7 nm to 20 nm being more typical.

Figure 5:
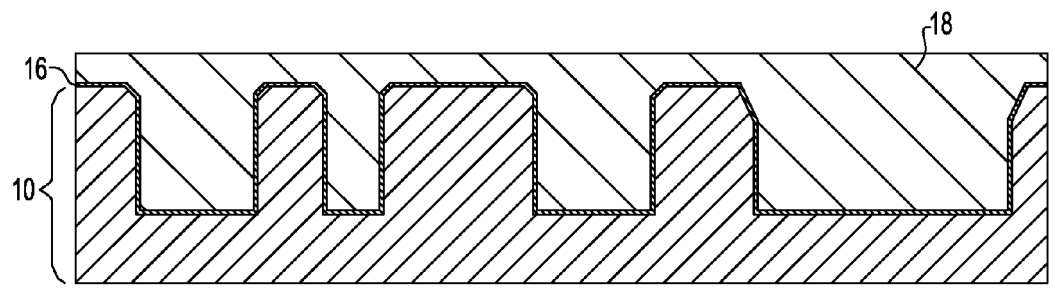
FIG. 5 is a pictorial representation (through a cross sectional view) illustrating the structure of FIG. 4 after forming a conductive material on the exposed surface of the diffusion barrier.

Referring to FIG. 5, there is illustrated the structure of FIG. 4 after forming a conductive material 18 on the exposed surface of the diffusion barrier 16 that is located within and outside each of the openings of the plurality of openings (12 and 14). The conductive material 18 that can be employed in the present disclosure includes, for example, polySi, a conductive metal, an alloy comprising at least two conductive metals, a conductive metal silicide or combinations thereof. In one embodiment, the conductive material 18 is a conductive metal such as Cu, W or Al. In another embodiment, the conductive material 18 is comprised of Cu or a Cu alloy (such as AlCu).

The conductive material 18 is formed utilizing a conventional deposition process including, but not limited to, CVD, PECVD, sputtering, chemical solution deposition or plating.

In some embodiments, especially when Cu or a Cu alloy is employed as the conductive material 18, an optional plating seed layer (not shown) can be formed on the diffusion barrier 16 prior to forming the conductive material. The optional plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

Figure 6:
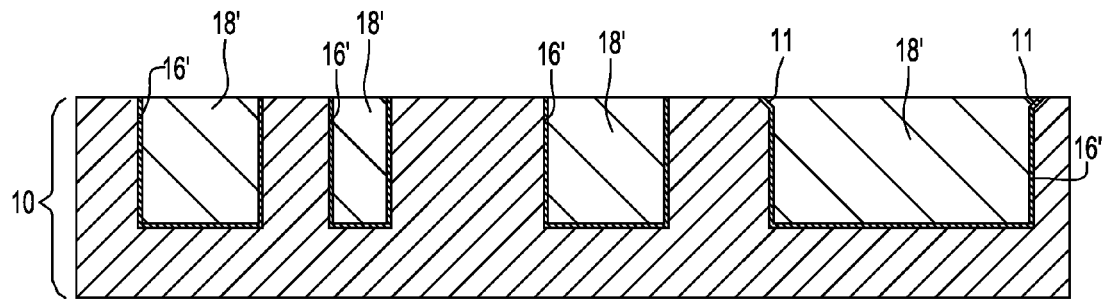
FIG. 6 is a pictorial representation (though a cross sectional view) illustrating the structure of FIG. 5 after performing a planarization process in which beveled corners may remain within line openings that were formed into the dielectric material.

Referring to FIG. 6, there is illustrated the structure of FIG. 5 after performing a planarization process such as, for example, chemical mechanical polishing and/or grinding. The planarization process removes the portions of the diffusion barrier 16, and the conductive material 18 that are outside of each opening of the plurality of openings (12 and 14) and present above the upper horizontal surface of the interconnect dielectric material 10. In the drawings, reference numeral 18' denotes the remaining conductive material (which can be referred to a conductive feature) and reference numeral 16' denotes the remaining diffusion barrier after planarization. As shown, elements 16' and 18' each have an upper surface that is coplanar with each other as well as with that of the upper surface of the interconnect dielectric material 10. It also noted the remaining diffusion barrier 16' is contiguously present in each opening of the plurality of openings (12 and 14). By "contiguously present" it is meant that there are no breaks in the diffusion barrier 16' within each opening of the plurality of openings (12 and 14). It further noted that for the each line opening 14 some beveling may remain at the upper corners of the planarization structure such as shown, for example, in FIG. 6.

In this above described embodiment of the present application, which is illustrated in FIGS. 1-6, the beveled corners within the interconnect dielectric material reduce the probability of metal void formation in the interconnect structure by increasing the width of each opening that is located at the upper surface of the interconnect dielectric material.

Figure 7:
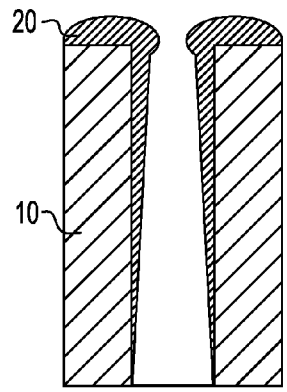
FIG. 7 is a pictorial representation (through a cross sectional view) illustrating the structure of FIG. 2 after forming a diffusion barrier or a multilayered structure comprising a diffusion barrier and a plating seed layer on the exposed surfaces of the interconnect dielectric material in accordance with another embodiment of the present disclosure.

Referring to FIG. 7, there is illustrated a portion of the structure shown in FIG. 2 after forming a diffusion barrier or a multilayered stack comprising a diffusion barrier and a plating seed layer (in the drawing reference numeral 20 is used to illustrate either embodiment) on the exposed surfaces of an interconnect dielectric material 10 including a plurality of openings formed therein in accordance with another embodiment of the present discourse. In this embodiment, the interconnect dielectric material 10 and the plurality of openings are processed as described above in FIGS. 1 and 2 of the present disclosure. The diffusion barrier or a multilayered stack comprising a diffusion barrier and a plating seed layer (i.e., element 20 in the drawings) can include one of the materials and be within the thickness ranges mentioned above for diffusion barrier 16 and the optional plating seed layer. The diffusion barrier or a multilayered stack comprising a diffusion barrier and a plating seed layer (i.e., element 20 in the drawings) can be formed as described above.

Figure 8:
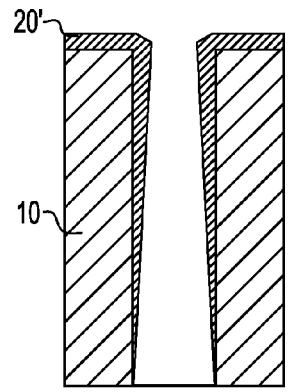
FIG. 8 is a pictorial representation (through a cross sectional view) illustrating the structure of FIG. 7 after reducing an overhang profile of the diffusion barrier or the multilayered structure comprising a diffusion barrier and a plating seed layer located at the upper corners of each opening present in the interconnect dielectric material.

Referring to FIG. 8, there is illustrated the structure of FIG. 7 after reducing an overhang profile of the diffusion barrier or a multilayered structure comprising a diffusion barrier and a seed layer (i.e., element 20) located at the upper corners of each opening present in the interconnect dielectric material. By "overhang profile" it is meant a bread-loafing of material at the top opening of the via/trench. Stated in other terms, the overhang profile has a greater width associated therewith as compared to the remaining width of element 20.

In FIG. 8, element 20' denotes either the diffusion barrier or a multilayered structure comprising a diffusion barrier and a plating seed layer after performing a gas cluster ion beam etching process. In this embodiment, the gas cluster ion beam etching process that is used to reduce the overhang profile of element 20 includes the same gas cluster ion beam etching process as described above in connection with forming the beveled corners within an upper region of each of the openings that were formed into the interconnect dielectric material.

In this embodiment, and by utilizing a gas cluster ion beam etching process, the overhang profile of element 20 can be reduced by at least 10%. More typically, gas cluster ion beam etching can be used to reduce the overhang profile of element 20 by 10% to 20%. In this embodiment, the reduction in overhang profile reduces the probability of metal void formation in the interconnect structure.

Figure 9:
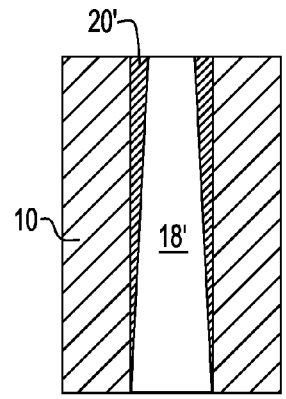
FIG. 9 is a pictorial representation (through a cross sectional view) illustrating the structure of FIG. 8 after forming a conductive material and planarization.

Referring to FIG. 9, there is illustrated the structure of FIG. 8 after forming a conductive material and planarization which forms conductive material 18' within each opening that is coplanar with an upper surface the interconnect dielectric material. The conductive material can include one of the conductive materials mentioned above and the conductive material can be formed as mentioned above as well. Chemical mechanical polishing and/or grinding can be used to form conductive material 18' within each of the openings.

Figure 10:
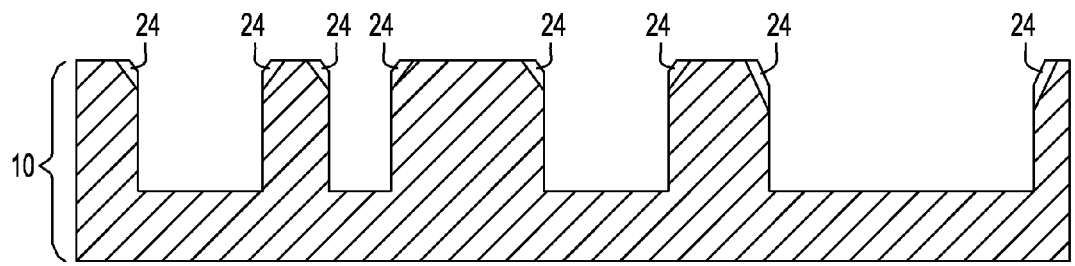
FIG. 10 is a pictorial representation (through a cross sectional view) depicting the structure of FIG. 2 after forming a deactivated region at upper corners of each of the plurality of openings that are present in the interconnect dielectric material.

Referring to FIG. 10, there is depicted the structure of FIG. 2 after forming deactivated regions 24 within the upper substantially square corners of each opening of the plurality of openings that are present in the interconnect dielectric material 10. Specifically, and in this embodiment of the present disclosure, a gas cluster ion beam process can be used to form each deactivated region 24. In this embodiment, the gas cluster ion beam process introduces a material within the interconnect dielectric material that deactivates the upper substantially square corners of each opening that is formed into an interconnect dielectric material.

In one embodiment, the gas cluster ion beam process used to form the deactivated regions 24 within the upper substantially square corners of the interconnect dielectric material 10 can be performed with a dose from 1e12 clusters/cm$^2$ to 1e18 clusters/cm$^2$. In another embodiment, the gas cluster ion beam process used to form the deactivated regions 24 within the upper substantially square corners of the interconnect dielectric material 10 can be performed with a dose from 1e14-clusters/cm$^2$ to 1e18 clusters/cm$^2$. Other doses that are below and/or above the aforementioned ranges can also be employed in the present disclosure.

In one embodiment, the gas cluster ion beam process used to form the deactivated regions 24 can be employed in the present disclosure can be performed at a pressure from $10^{-2}$ Torr to $10^{-6}$ Torr. In another embodiment, the gas cluster ion beam process used to form the deactivated regions 24 can be performed at a pressure from $10^{-3}$ Torr to $10^{-6}$ Torr. Other pressure values that are below and/or above the aforementioned ranges can also be employed in the present disclosure.

In one embodiment, the gas cluster ion beam process that can be used to form the deactivated regions 24 can be performed at a power/energy from 2 keV to 80 keV. In another embodiment, the gas cluster ion beam process that can be used to form the deactivated regions 24 can be performed at a power/energy from 20 keV to 60 keV. Other power/energy values that are below and/or above the aforementioned ranges can also be employed in the present disclosure.

In one embodiment of the present disclosure, the gas cluster ion beam process used to form the deactivated regions 24 can be performed at a temperature from 20° C. to 500° C. In another embodiment of the present disclosure, the gas cluster ion beam process can be performed at a temperature from 20° C. to 400° C. Other temperatures that are below and/or above the aforementioned ranges can also be employed in the present disclosure.

In one embodiment, the gas cluster ion beam process used to form the deactivated regions 24 is performed utilizing a beam of gas cluster ions whose angle incident to the upper surface of the interconnect dielectric material 10 is 5° or less. In another embodiment, the gas cluster ion beam process that can be used to form the deactivated regions 24 is performed utilizing a beam of gas cluster ions whose angle incident to the upper surface of the interconnect dielectric material 10 is from 1° to 3°.

In some embodiments of the present disclosure, the structure is held stationary by a chuck or other wafer holding means, while the beam of gas cluster ions is rotated. In another embodiment, the structure is rotated while holding the beam of gas cluster ions stationary. Either embodiment can be used to form the deactivated regions 24 within each substantially square corner of that is formed into the interconnect dielectric material 10.

In this embodiment, the gas used in the gas cluster ion beam process includes a material that is capable of forming a deactivated surface. By "deactivated surface" it is meant a surface in which the growth rate of a subsequent material will be less than the growth rate on remaining portions of the interconnect dielectric material 10 that do not include the deactivated region 24. Illustrative examples of gases that can be employed in this embodiment of the present disclosure include, but are not limited to, $B_2H_6$, nitrogen ($N_2$) and/or oxygen ($O_2$). The deactivating gas can be used neat (i.e., 100% pure reactive gas), or the deactivating gas can be admixed with a quantity of an inert gas such as, for example, neon (Ne), helium (He), argon (Ar), krypton (Kr) and/or xenon (Xe). In one embodiment, the quantity of deactivating gas may be from 0.1% to 5%, with the remaining 99.9% to 95% comprising an inert gas as a carrier gas. In another embodiment, the quantity of deactivating gas may be from 1% to 10%, with the remaining 99 to 90% comprising an inert gas as a carrier gas.

After forming the structure shown in FIG. 11, the processing steps described in conjunction with FIGS. 4-6 may be employed. In this embodiment, the deactivated regions 24 prevent the formation of an overhang profile that can lead to metal void formation in the interconnect structure. In this embodiment, portions of the deactivating regions may remain in line openings that are formed into the interconnect dielectric material.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of reducing metal void formation in an interconnect structure comprising:
forming a plurality of openings within an interconnect dielectric material, each opening of said plurality of openings having upper corners that are substantially square;
performing a gas cluster ion beam etching process to said upper corners of each opening to provide beveled corners, said gas cluster ion beam etching process including beams of gas cluster ions each of which has an angle incident to the upper surface of the interconnect dielectric material of 5° or less;
forming a diffusion barrier within each opening of the plurality of openings;
forming a conductive material atop the diffusion barrier; and
removing portions of the diffusion barrier and the conductive material that extend outside of each opening of the plurality of openings to provide a planarized interconnect structure.

2. The method of claim 1, wherein said gas cluster ion beam etching process is performed utilizing a reactive gas.

3. The method of claim 2, wherein said reactive gas comprises at least one of nitrogen trifluoride ($NF_3$), carbon tetrafluoride ($CF_4$), and methane ($CH_4$).

4. The method of claim 3, wherein said reactive gas further comprises an inert gas as a carrier gas.

5. The method of claim 1, wherein said gas cluster ion beam etching process is performed utilizing a non-reactive gas.

6. The method of claim 5, wherein said non-reactive gas comprises an inert gas.

7. A method of reducing metal void formation in an interconnect structure comprising:
forming a plurality of openings within an interconnect dielectric material, each opening of said plurality of openings having upper corners that are substantially square;
forming at least one material within each opening of said plurality of openings, said at least one material having an overhang profile located at the upper corners of each opening of the plurality of openings;
performing a gas cluster ion beam etching process to said overhang profile of said at least one material that is located at said upper corners of each opening to reduce the overhang profile by at least 10%, said gas cluster ion beam etching process including beams of gas cluster ions each of which has an angle incident to the upper surface of the interconnect dielectric material of 5° or less;
forming a conductive material within remaining portions of each opening of the plurality of openings; and
removing portions of the at least one material having the reduced overhang profile and the conductive material that extend outside of each opening of the plurality of openings to provide a planarized interconnect structure.

8. The method of claim 7, wherein said gas cluster ion beam etching process is performed utilizing a reactive gas.

9. The method of claim 8, wherein said reactive gas comprises at least one of nitrogen trifluoride ($NF_3$), carbon tetrafluoride ($CF_4$), and methane ($CH_4$).

10. The method of claim 9, wherein said reactive gas further comprises an inert gas as a carrier gas.

11. The method of claim 7, wherein said gas cluster ion beam etching process is performed utilizing a non-reactive gas.

12. The method of claim 11, wherein said non-reactive gas comprises an inert gas.

13. The method of claim 7, wherein said at least one material is a diffusion barrier or a multilayered stack comprising a diffusion barrier and a metal seed layer.

14. A method of reducing metal void formation in an interconnect structure comprising:
forming a plurality of openings within an interconnect dielectric material, each opening of said plurality of openings having upper corners that are substantially square;
performing a gas cluster ion beam process to said upper corners of each opening to provide deactivated corners within the interconnect dielectric material at said upper corners, said gas cluster ion beam process comprises beams of gas cluster ions of a deactivating gas each of which has an angle incident to the upper surface of the interconnect dielectric material of 5° or less;
forming a diffusion barrier within each opening of the plurality of openings;
forming a conductive material atop the diffusion barrier; and
removing portions of the diffusion barrier and the conductive material that extend outside of each opening of the plurality of openings to provide a planarized interconnect structure.

15. The method of claim 14, wherein said deactivating gas comprises nitrogen, oxygen or $B_2H_6$.

16. The method of claim 15, wherein said deactivating gas further comprises an inert gas as a carrier gas.

17. The method of claim 14, wherein said deactivating regions corners reduce growth rate of said diffusion barrier thereby preventing an overhang profile at the upper corners of each opening of the plurality of openings.

* * * * *